United States Patent
Tsai et al.

(10) Patent No.: US 9,012,315 B2
(45) Date of Patent: Apr. 21, 2015

(54) METHODS AND SYSTEMS FOR DOPANT ACTIVATION USING MICROWAVE RADIATION

(71) Applicant: Taiwan Semiconductor Manufacturing Company Limited, Hsinchu (TW)

(72) Inventors: Chun Hsiung Tsai, Hsinchu County (TW); Yan-Ting Lin, Hsinchu County (TW); Cheng-Yan Zhan, Taipei (TW); Yi-Tang Lin, Hsinchu (TW); Clement Hsingjen Wann, New York, NY (US)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 13/963,043

(22) Filed: Aug. 9, 2013

(65) Prior Publication Data

US 2015/0041966 A1     Feb. 12, 2015

(51) Int. Cl.
*H01L 21/268*     (2006.01)
*H01L 29/36*     (2006.01)
*H05B 6/80*     (2006.01)

(52) U.S. Cl.
CPC .............. *H01L 21/268* (2013.01); *H01L 29/36* (2013.01); *H05B 6/80* (2013.01)

(58) Field of Classification Search
CPC .... H01L 21/268; H01L 21/2686; H01L 29/36
USPC .......................................................... 438/550
See application file for complete search history.

(56) References Cited

U.S. PATENT DOCUMENTS

2007/0212859 A1*   9/2007   Carey et al. .................... 438/487
2010/0184281 A1*   7/2010   Hsu et al. ........................ 438/591

* cited by examiner

*Primary Examiner* — Roy Potter
*Assistant Examiner* — Paul Patton
(74) *Attorney, Agent, or Firm* — Jones Day

(57) ABSTRACT

Systems and methods are provided for activating dopants in a semiconductor structure. For example, a semiconductor structure including a plurality of dopants is provided. One or more microwave-absorption materials are provided, the microwave-absorption materials being capable of increasing an electric field density associated with the semiconductor structure. Microwave radiation is applied to the microwave-absorption materials and the semiconductor structure to activate the plurality of dopants for fabricating semiconductor devices. The microwave-absorption materials are configured to increase the electric field density in response to the microwave radiation so as to increase the semiconductor structure's absorption of the microwave radiation to activate the dopants.

18 Claims, 3 Drawing Sheets

METHODS AND SYSTEMS FOR DOPANT ACTIVATION USING MICROWAVE RADIATION

FIELD

The technology described in this patent document relates generally to semiconductor materials and more particularly to processing of semiconductor materials.

BACKGROUND

Fabrication of semiconductor devices often involves many process steps. For example, the process of fabricating a field effect transistor usually includes doping a semiconductor substrate (e.g., adding desired impurities into the substrate) to form source/drain junctions. Many different methods may be implemented for doping the substrate, such as ion implantation, diffusion, and epitaxial growth. Further, the dopants introduced into the substrate often need to be electrically activated before semiconductor devices can be fabricated on the substrate. The activation of the dopants often includes dissolving dopant clusters, and transferring the dopant atoms/molecules from interstitial positions into lattice sites of the lattice structure of the substrate. As an example, the dopants may be activated using rapid thermal annealing (RTA), or millisecond thermal annealing (MSA).

Under certain circumstance, the fabrication process of semiconductor devices involves microwave radiation which typically includes electromagnetic waves with wavelengths ranging from 1 m to 1 mm (corresponding to frequencies between 0.3 and 300 GHz). When microwave radiation is applied to a certain material (e.g., a dielectric material) which includes electric dipoles, the dipoles change their orientations in response to the changing electric fields of the microwave radiation and thus the material may absorb the microwave radiation to generate heat. The response of the material to the electric field of the microwave radiation can be measured using a complex permittivity, $\delta(\omega)^*$, which depends on the frequency of the electric field:

$$\in(\omega)^* = \in(\omega)' - i\in(\omega)'' = \in_0(\in_r(\omega)' - i\in_r(\omega)'') \quad (1)$$

where $\omega$ represents the frequency of the electric field, $\in(\omega)'$ represents a real component of the complex permittivity (i.e., a dielectric constant), and $\in(\omega)''$ represents a dielectric loss factor. In addition, $\delta_0$ represents the permittivity of a vacuum, $\in_r(\omega)'$ represents the relative dielectric constant, and $\in_r(\omega)''$ represents the relative dielectric loss factor.

Whether a material can absorb the microwave radiation can be characterized using a loss tangent, $\tan \delta$:

$$\tan \delta = \frac{\varepsilon'' \mu' - \varepsilon' \mu''}{\varepsilon' \mu' + \varepsilon'' \mu''} \quad (2)$$

where $\mu'$ represents a real component of the magnetic permeability of the material, and $\mu''$ represents a magnetic loss factor. Assuming negligible magnetic loss (i.e., $\mu''=0$), the loss tangent of a material is expressed as follows:

$$\tan \delta = \frac{\varepsilon''}{\varepsilon'} = \frac{\varepsilon_r''}{\varepsilon_r'} \quad (3)$$

Materials with a low loss tangent (e.g., $\tan \delta < 0.01$) allow microwaves to pass through with very little absorption. Materials with an extremely high loss tangent (e.g., $\tan \delta > 10$) reflect microwaves with little absorption. Materials with an intermediate loss tangent (e.g., $10 \geq \tan \delta \geq 0.01$) can absorb microwave radiation.

SUMMARY

In accordance with the teachings described herein, systems and methods are provided for activating dopants in a semiconductor structure. For example, a semiconductor structure including a plurality of dopants is provided. One or more microwave-absorption materials are provided, the microwave-absorption materials being capable of increasing an electric field density associated with the semiconductor structure. Microwave radiation is applied to the microwave-absorption materials and the semiconductor structure to activate the plurality of dopants for fabricating semiconductor devices. The microwave-absorption materials are configured to increase the electric field density in response to the microwave radiation so as to increase the semiconductor structure's absorption of the microwave radiation to activate the dopants.

In one embodiment, an article for fabricating semiconductor devices includes a semiconductor structure including a plurality of dopants, and one or more microwave-absorption layers formed on the semiconductor structure. The microwave-absorption layers are capable of increasing an electric field density associated with the semiconductor structure. When microwave radiation is applied to the semiconductor structure and the microwave-absorption layers, the microwave-absorption layers increase the electric field density in response to the microwave radiation so as to increase the semiconductor structure's absorption of the microwave radiation to activate the dopants for fabricating semiconductor devices.

In another embodiment, a system for activating dopants in a semiconductor structure includes one or more microwave-absorption materials and a microwave-radiation component. The microwave-absorption materials are disposed at a predetermined distance from a semiconductor structure including a plurality of dopants, the microwave-absorption materials being capable of increasing an electric field density associated with the semiconductor structure. The microwave-radiation component is configured to apply microwave radiation to the microwave-absorption materials and the semiconductor structure to activate the plurality of dopants for fabricating semiconductor devices. The microwave-absorption materials are configured to increase the electric field density in response to the microwave radiation so as to increase the semiconductor structure's absorption of the microwave radiation to activate the dopants.

DETAILED DESCRIPTION

The conventional technology for dopant activation, such as RTA and MSA, often involves high processing temperatures.

For example, RTA is usually performed at a temperature higher than 950° C., and MSA at a temperature higher than 1050° C. Such high processing temperatures may not be suitable for some modern semiconductor devices. For example, certain materials (e.g., germanium, tin) used in modern complementary metal-oxide-semiconductor (CMOS) devices have low melting points, which limits the processing temperature for fabricating the devices.

Figure 1:
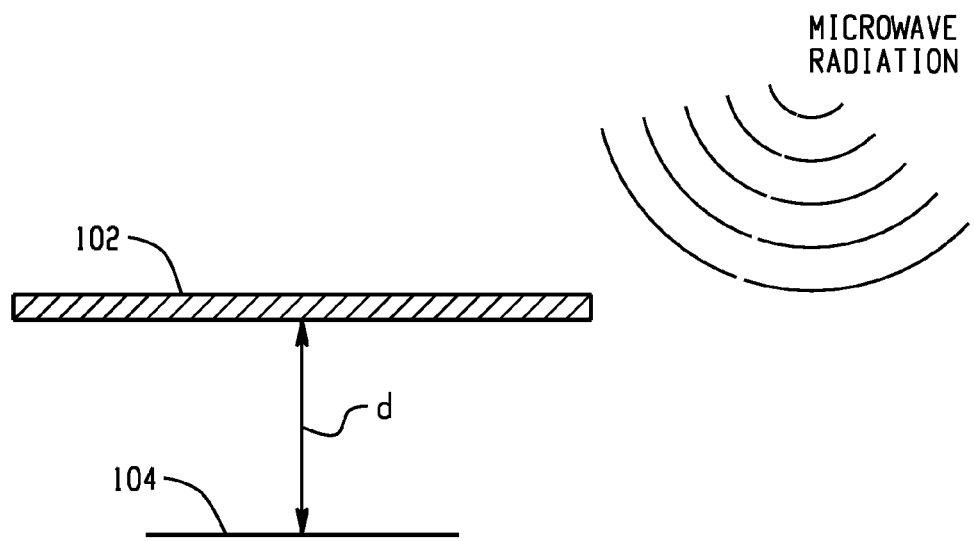
FIG. 1 depicts an example diagram for dopant activation using microwave radiation.

FIG. 1 depicts an example diagram for dopant activation using microwave radiation. As shown in FIG. 1, an microwave-absorption material 102 is placed at a distance (e.g., d) from a semiconductor structure 104 which includes dopants, where microwave radiation may be applied to both the microwave-absorption material 102 and the semiconductor structure 104 in order to activate the dopants in the semiconductor structure 104.

The semiconductor structure 104 which has a small loss tangent may not absorb microwave radiation efficiently. On the other hand, the microwave-absorption material 102 which has a larger loss tangent (e.g., in a range of about 0.01 to about 2) may absorb sufficient microwave radiation and increase an electric field density over the semiconductor structure 104. At the raised electric field density, the loss tangent of the semiconductor structure 104 may increase, and the semiconductor structure 104 may absorb the microwave radiation more efficiently so that the dopants within the semiconductor structure 104 may be activated for fabrication of semiconductor devices.

For example, the semiconductor structure 104 may include a junction with a number of dopants. The junction including the dopants may be formed on a substrate at an elevated temperature (e.g., in a range of about 300° C. to about 600° C.) by epitaxial growth, for example, through chemical vapor deposition (CVD). In response to the applied microwave radiation, the microwave-absorption material 102 intensifies the electric field density over the semiconductor structure 104. More and more dipoles related to the dopants may be formed in the semiconductor structure 104, and these dipoles may vibrate and/or rotate in response to the applied microwave radiation. The semiconductor structure 104 may absorb more microwave radiation under the increased electric field density. Once the electric field density over the semiconductor structure 104 exceeds a threshold, the dipole formation and the dipole motions (e.g., vibration and/or rotation) may eventually break down the bonds between the dopants and the interstitial sites in the semiconductor structure 104, so that the dopants may be activated. The distance between the microwave-absorption material 102 and the semiconductor structure 104 may be adjusted to improve the dopant activation. For example, the dopants may include phosphorous, phosphorous-based molecules, germanium, helium, boron, boron-based molecules, or a combination thereof.

In one embodiment, the microwave radiation applied to the microwave-absorption material 102 may have a frequency in the range of about 2 GHz to about 10 GHz. For example, the microwave-absorption material 102 may include boron-doped silicon germanium, silicon phosphide, titanium, nickel, silicon nitride, silicon dioxide, silicon carbide, or a combination thereof. The microwave-absorption material 102 may have a much larger size than the semiconductor structure 104 so that the electric field density may be approximately uniform over the semiconductor structure 104. As an example, the semiconductor structure 104 may include a semiconductor substrate, a semiconductor-on-insulator structure, or a semiconductor thin film structure.

In another embodiment, to control dopant diffusion, the temperature of the semiconductor structure 104 may be kept within a range of about 300° C. to about 600° C. For example, the microwave radiation may be applied to the microwave-absorption material 102 and the semiconductor structure 104 for a time period within a range of about 40 seconds to about 300 seconds.

Figure 2:
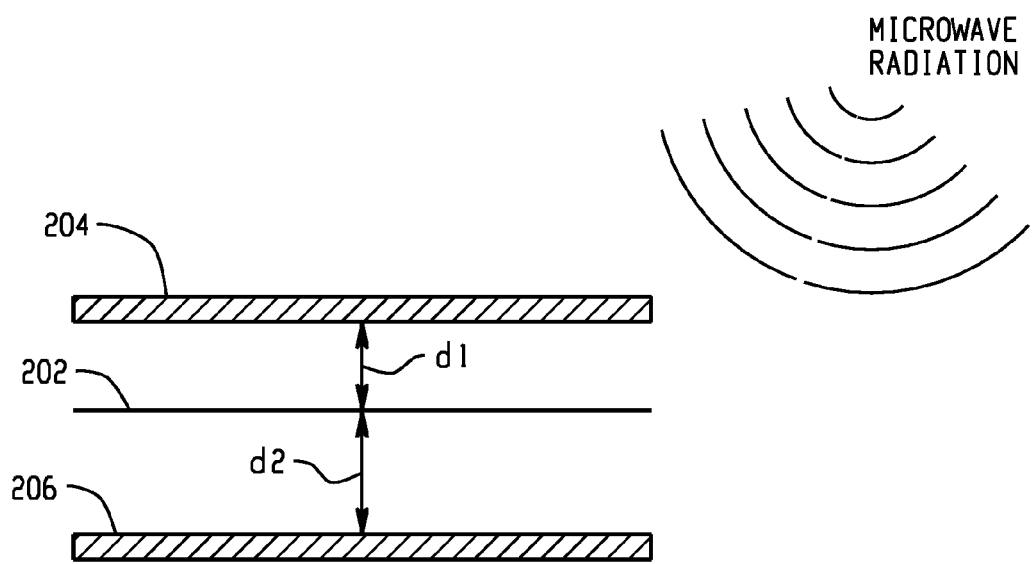
FIG. 2 depicts another example diagram for dopant activation using microwave radiation.

FIG. 2 depicts another example diagram for dopant activation using microwave radiation. As shown in FIG. 2, a semiconductor structure 202 including dopants is placed between two microwave-absorption materials 204 and 206, where microwave radiation may be applied to the semiconductor structure 202 and the microwave-absorption materials 204 and 206 in order to activate the dopants in the semiconductor structure 202. For example, the microwave-absorption materials 204 and 206 may have the same loss tangent or different loss tangents. As an example, the distance (e.g., d1) between the microwave-absorption material 204 and the semiconductor structure 202 may be the same as or different from the distance (e.g., d2) between the microwave-absorption material 206 and the semiconductor structure 202. The distances d1 and d2 may be adjusted to improve the dopant activation. In one embodiment, the microwave-absorption material 204 may be placed above a top surface of the semiconductor structure 202, and the microwave-absorption material 206 may be placed below a bottom surface of the semiconductor structure 202. In another embodiment, the microwave-absorption material 204 may be placed over a side surface of the semiconductor structure 202, and the microwave-absorption material 206 may be placed over another side surface of the semiconductor structure 202. In yet another embodiment, multiple microwave-absorption materials may be placed above the top surface, below the bottom surface, and over one or more side surfaces of the semiconductor structure 202.

Figure 3:
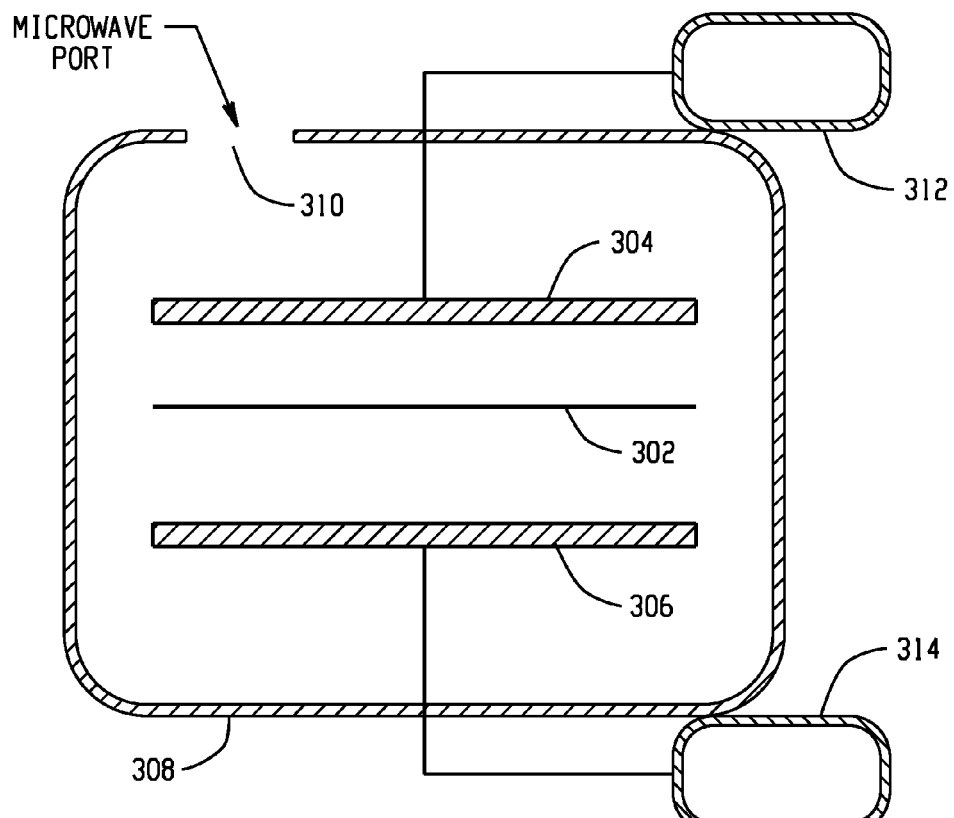
FIG. 3 depicts an example diagram showing an apparatus for dopant activation using microwave radiation.

FIG. 3 depicts an example diagram showing an apparatus for dopant activation using microwave radiation. As shown in FIG. 3, a semiconductor structure 302 including dopants is placed between two microwave-absorption materials 304 and 306 within a shell 308. The shell 308 includes a microwave port 310 through which microwave radiation may be introduced. For example, the shell 308 may be made of a metal material. The microwave-absorption materials 304 and 306 may be pre-heated to predetermined temperatures (e.g., in a range of about 300° C. to about 600° C.) by heat sources 312 and 314, respectively. For example, the heat sources 312 and 314 may include an Ar lamp, a Xeon lamp, or a tungsten-halogen lamp. In another example, the heat sources 312 and 314 may include one or more electrical power sources (e.g., silicon-controlled rectifiers).

Figure 4:
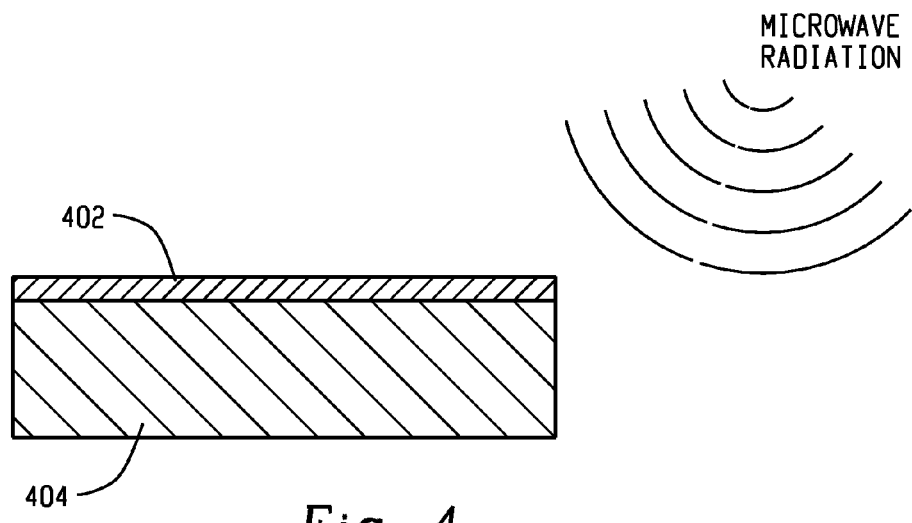
FIG. 4 depicts an example diagram for dopant activation using microwave radiation.

FIG. 4 depicts an example diagram for dopant activation using microwave radiation. As shown in FIG. 4, a microwave-absorption layer 402 may be formed on a semiconductor structure 404 which includes dopants, where microwave radiation may be applied to the microwave-absorption layer 402 and the semiconductor structure 404. For example, the microwave-absorption layer 402 may be formed on the semiconductor structure 404 through epitaxial growth (e.g., CVD). The thickness of the microwave-absorption layer 402 may be adjusted to improve the dopant activation. For example, the microwave-absorption layer 402 may be formed on the semiconductor structure 404 through epitaxial growth (e.g., CVD). After the dopant activation, the microwave-absorption layer 402 may be substantially removed, for example, through etching (e.g., wet etching, dry etching) or chemical-mechanical polishing.

Figure 5:
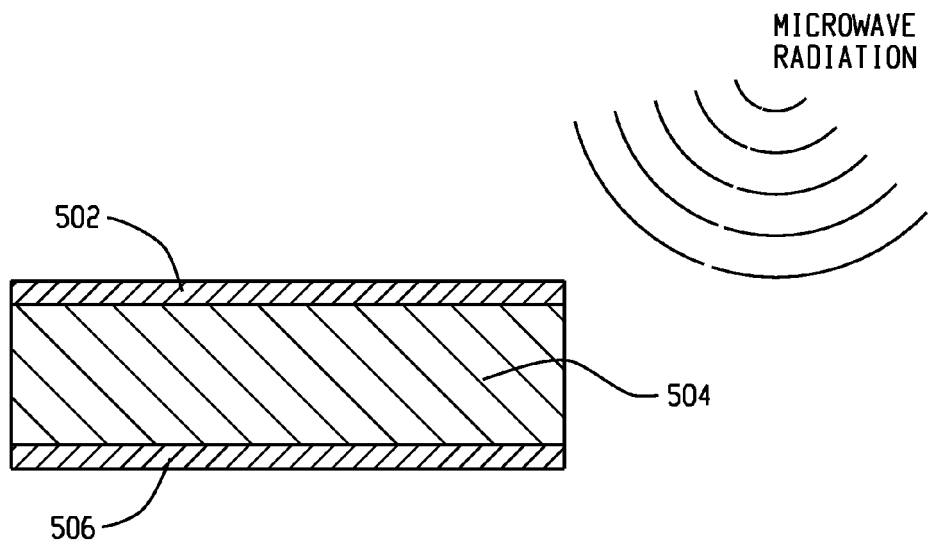
FIG. 5 depicts another example diagram for dopant activation using microwave radiation.

FIG. 5 depicts another example diagram for dopant activation using microwave radiation. As shown in FIG. 5, a microwave-absorption layer 502 may be formed on a top surface of a semiconductor structure 504 which includes dopants, and another microwave-absorption layer 506 may be formed on a bottom surface of the semiconductor structure 504. Microwave radiation may be applied to the semiconductor structure 504 and the microwave-absorption layers 502 and 506 for dopant activation. In one embodiment, the microwave-absorption layer 502 may be formed on a side surface of the semiconductor structure 504, and the microwave-absorption layer 506 may be formed on another side surface of the semiconductor structure 504. In another embodiment, multiple microwave-absorption layers may be formed on the top surface, on the bottom surface, and on one or more side surfaces of the semiconductor structure 504.

Figure 6:
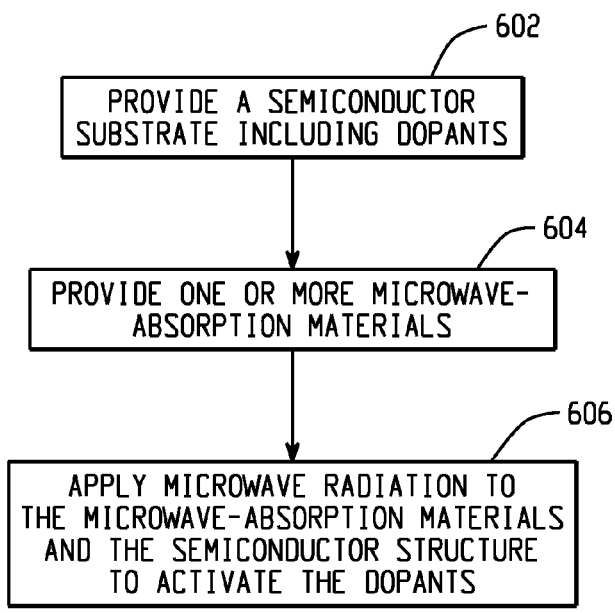
FIG. 6 depicts an example flow chart for dopant activation using microwave radiation.

FIG. 6 depicts an example flow chart for dopant activation using microwave radiation. As shown in FIG. 6, at 602, a semiconductor structure is provided, where the semiconductor structure includes a plurality of impurities, such as dopants. At 604, one or more microwave-absorption materials are provided. The microwave-absorption materials are capable of increasing an electric field density associated with the semiconductor structure. At 606, microwave radiation is applied to the microwave-absorption materials and the semiconductor structure to activate the plurality of dopants for fabricating semiconductor devices. The microwave-absorption materials are configured to increase the electric field density in response to the microwave radiation so as to increase the semiconductor structure's absorption of the microwave radiation to activate the dopants.

This written description uses examples to disclose the invention, include the best mode, and also to enable a person skilled in the art to make and use the invention. The patentable scope of the invention may include other examples that occur to those skilled in the art. One skilled in the relevant art will recognize that the various embodiments may be practiced without one or more of the specific details, or with other replacement and/or additional methods, materials, or components. Well-known structures, materials, or operations may not be shown or described in detail to avoid obscuring aspects of various embodiments of the invention. Various embodiments shown in the figures are illustrative example representations and are not necessarily drawn to scale. Particular features, structures, materials, or characteristics may be combined in any suitable manner in one or more embodiments. Various additional layers and/or structures may be included and/or described features may be omitted in other embodiments. Various operations may be described as multiple discrete operations in turn, in a manner that is most helpful in understanding the invention. However, the order of description should not be construed as to imply that these operations are necessarily order dependent. In particular, these operations need not be performed in the order of presentation. Operations described herein may be performed in a different order, in series or in parallel, than the described embodiment. Various additional operations may be performed and/or described. Operations may be omitted in additional embodiments.

This written description and the following claims may include terms, such as left, right, top, bottom, over, under, upper, lower, first, second, etc. that are used for descriptive purposes only and are not to be construed as limiting. For example, terms designating relative vertical position may refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and may still fall within the meaning of the term "top." The term "on" as used herein (including in the claims) may not indicate that a first layer "on" a second layer is directly on and in immediate contact with the second layer unless such is specifically stated; there may be a third layer or other structure between the first layer and the second layer on the first layer. The term "under" as used herein (including in the claims) may not indicate that a first layer "under" a second layer is directly under and in immediate contact with the second layer unless such is specifically stated; there may be a third layer or other structure between the first layer and the second layer under the first layer. The embodiments of a device or article described herein can be manufactured, used, or shipped in a number of positions and orientations. Persons skilled in the art will recognize various equivalent combinations and substitutions for various components shown in the figures.

What is claimed is:

1. A method for activating dopants in a semiconductor structure, the method comprising:
   providing a semiconductor structure including a plurality of dopants;
   providing one or more microwave-absorption materials capable of increasing an electric field density associated with the semiconductor structure; and
   applying microwave radiation to the microwave-absorption materials and the semiconductor structure to activate the plurality of dopants for fabricating semiconductor devices;
   wherein the microwave-absorption materials are configured to increase the electric field density in response to the microwave radiation so as to increase the semiconductor structure's absorption of the microwave radiation to activate the dopants, and
   wherein the microwave-absorption materials include a first component placed at a first distance from the semiconductor structure.

2. The method of claim 1, wherein:
   the semiconductor structure includes one or more dopant clusters; and
   the semiconductor structure's absorption of microwave radiation is increased in response to the increased electric field density so as to dissolve the dopant clusters.

3. The method of claim 1, wherein the first distance is adjusted to improve the activation of the dopants.

4. The method of claim 1, where the microwave-absorption materials include a second component placed at a second distance from the semiconductor structure.

5. The method of claim 4, wherein the semiconductor structure is placed between the first component and the second component.

6. A method for activating dopants in a semiconductor structure, the method comprising:
   providing a semiconductor structure including a plurality of dopants;
   providing one or more microwave-absorption materials capable of increasing an electric field density associated with the semiconductor structure, wherein the one or more microwave-absorption materials are formed on the semiconductor structure through epitaxial growth on the semiconductor structure; and
   applying microwave radiation to the microwave-absorption materials and the semiconductor structure to activate the plurality of dopants for fabricating semiconductor devices;
   wherein the microwave-absorption materials are configured to increase the electric field density in response to the microwave radiation so as to increase the semiconductor structure's absorption of the microwave radiation to activate the dopants.

7. The method of claim 1, further comprising:
pre-heating the microwave-absorption materials to a predetermined temperature.

8. The method of claim 1, wherein the microwave-absorption materials are selected from a group consisting of: boron-doped silicon germanium, silicon phosphide, titanium, nickel, silicon nitride, silicon dioxide, and silicon carbide.

9. The method of claim 1, wherein the microwave radiation has a frequency within a range of approximately 2 GHz to approximately 10 GHz.

10. A method for activating dopants in a semiconductor structure, the method comprising:
providing a semiconductor structure including a plurality of dopants;
providing one or more microwave-absorption materials capable of increasing an electric field density associated with the semiconductor structure, wherein the microwave-absorption materials are substantially larger than the semiconductor structure; and
applying microwave radiation to the microwave-absorption materials and the semiconductor structure to activate the plurality of dopants for fabricating semiconductor devices;
wherein the microwave-absorption materials are configured to increase the electric field density in response to the microwave radiation so as to increase the semiconductor structure's absorption of the microwave radiation to activate the dopants.

11. The method of claim 1, wherein the microwave-absorption materials have a loss tangent in a range of approximately 0.01 to approximately 2.

12. The method of claim 1, wherein the microwave-absorption materials are configured to increase the electric field density so as to affect dipoles formed in the semiconductor structure and motions of the formed dipoles.

13. The method of claim 12, wherein the formed dipoles are related to the plurality of dopants.

14. The method of claim 13, wherein the microwave-absorption materials are configured to increase the semiconductor structure's absorption of the microwave radiation to break bonds associated with the plurality of dopants.

15. An article for fabricating semiconductor devices, the article including:
a semiconductor structure including a plurality of dopants; and
one or more microwave-absorption layers disposed at a distance from the semiconductor structure, the microwave-absorption layers being capable of increasing an electric field density associated with the semiconductor structure;
wherein when microwave radiation is applied to the semiconductor structure and the microwave-absorption layers, the microwave-absorption layers increase the electric field density in response to the microwave radiation so as to increase the semiconductor structure's absorption of the microwave radiation to activate the plurality of dopants for fabricating semiconductor devices.

16. The article of claim 15, wherein the microwave-absorption layers have a loss tangent in a range of approximately 0.01 to approximately 2.

17. The article of claim 15, wherein the microwave radiation has a frequency within a range of approximately 2 GHz to approximately 10 GHz.

18. A system for activating dopants in a semiconductor structure, the system comprising:
one or more microwave-absorption materials disposed at a predetermined distance from a semiconductor structure including a plurality of dopants, the microwave-absorption materials being capable of increasing an electric field density associated with the semiconductor structure; and
a microwave-radiation component configured to apply microwave radiation to the microwave-absorption materials and the semiconductor structure to activate the plurality of dopants for fabricating semiconductor devices;
wherein the microwave-absorption materials are configured to increase the electric field density in response to the microwave radiation so as to increase the semiconductor structure's absorption of the microwave radiation to activate the dopants.

* * * * *